US012340864B2

United States Patent
Pilo et al.

(10) Patent No.: US 12,340,864 B2
(45) Date of Patent: Jun. 24, 2025

(54) INTERFACE LEVEL-SHIFTER DUAL-RAIL MEMORY ARCHITECTURE

(71) Applicant: Synopsys, Inc., Mountain View, CA (US)

(72) Inventors: Harold Pilo, Underhill, VT (US); Shishir Kumar, Noida (IN); Anurag Garg, Cupertino, CA (US); Peter Lee, Pleasanton, CA (US); John Edward Barth, Williston, VT (US)

(73) Assignee: Synopsys, Inc., Sunnyvale, CA (US)

( * ) Notice: Subject to any disclaimer, the term of this patent is extended or adjusted under 35 U.S.C. 154(b) by 144 days.

(21) Appl. No.: 18/107,450

(22) Filed: Feb. 8, 2023

(65) Prior Publication Data

US 2023/0260555 A1 Aug. 17, 2023

Related U.S. Application Data

(60) Provisional application No. 63/309,409, filed on Feb. 11, 2022.

(51) Int. Cl.
| | |
|---|---|
| *G11C 5/14* | (2006.01) |
| *G11C 7/06* | (2006.01) |
| *G11C 7/10* | (2006.01) |
| *G11C 7/22* | (2006.01) |
| *G11C 8/10* | (2006.01) |
| *G11C 29/10* | (2006.01) |

(52) U.S. Cl.
CPC ............... *G11C 5/148* (2013.01); *G11C 7/06* (2013.01); *G11C 7/1096* (2013.01); *G11C 7/222* (2013.01); *G11C 8/10* (2013.01); *G11C 29/10* (2013.01)

(58) Field of Classification Search
CPC ......... G11C 5/148; G11C 7/06; G11C 7/1096; G11C 7/222; G11C 8/10; G11C 29/10
USPC ...................................................... 365/189.16
See application file for complete search history.

(56) References Cited

U.S. PATENT DOCUMENTS

| 8,638,153 | B2 * | 1/2014 | Ge ........................ G11C 11/419 327/172 |
|---|---|---|---|
| 8,811,109 | B2 * | 8/2014 | Terzioglu ................. G11C 8/10 365/189.11 |
| 10,651,832 | B2 * | 5/2020 | Chen ................... H03K 17/6871 |
| 2009/0016146 | A1 * | 1/2009 | Fujisawa ............. G11C 11/4076 365/236 |
| 2020/0286561 | A1 * | 9/2020 | Berger ..................... G11C 8/06 |
| 2022/0319557 | A1 * | 10/2022 | Jain ........................ G11C 5/147 |

* cited by examiner

*Primary Examiner* — Sung Il Cho
(74) *Attorney, Agent, or Firm* — Patterson + Sheridan, LLP

(57) ABSTRACT

A memory device includes clock signal generation circuitry, and first integrated level shifter and latch circuitry. The clock signal generation circuitry receives a first clock signal and an isolation signal, and generates a second clock signal based on the first clock signal and the isolation signal. The isolation signal corresponds to a power state of a power supply associated with the first clock signal. The first integrated level shifter and latch circuitry receives an input signal in a first power supply domain, and latches a value the input signal based on the second clock signal. Further, the first integrated level shifter and latch circuitry outputs, based on the latched value, an output signal in a second power supply domain different than the first power supply domain.

19 Claims, 12 Drawing Sheets

INTERFACE LEVEL-SHIFTER DUAL-RAIL MEMORY ARCHITECTURE

RELATED APPLICATION

This application claims the benefit of U.S. provisional patent application Ser. No. 63/309,409, filed Feb. 11, 2022, which is hereby incorporated herein by reference.

BACKGROUND

Embedded memory devices operate at higher power supply voltages (e.g., a higher power supply domain) than that of corresponding control circuitry. Such devices are referred to as dual-rail (or dual-supply) memory devices. In one instance, the memory array core, or memory bank, and corresponding control circuitry operate in different power supply domains. In such instances, the inputs to the memory banks are shifted between the power supply domain voltages. In other instance, as the memory banks and control circuitry operate in different power supply domains, selected signals are shifted to the to the power supply domain of the memory bank.

SUMMARY

In one example, a memory device includes clock signal generation circuitry, and first integrated level shifter and latch circuitry. The clock signal generation circuitry receives a first clock signal and an isolation signal, and generates a second clock signal based on the first clock signal and the isolation signal. The isolation signal corresponds to a power state of a power supply associated with the first clock signal. The first integrated level shifter and latch circuitry receives an input signal in a first power supply domain, and latches a value the input signal based on the second clock signal. Further, the first integrated level shifter and latch circuitry outputs, based on the latched value, an output signal in a second power supply domain different than the first power supply domain.

In one example, a circuit device receives a first input signal in a first power supply domain. Further, the circuit device latches a value of the first input signal based on a latch clock signal. The latch clock signal is generated based on a first clock signal associated with the first power supply domain and an isolation signal that corresponds to a power state of a power supply associated with the first power supply domain. The circuit device further outputs, based on the latched value, a first output signal in a second power supply domain different than the first power supply domain.

In one example, an integrated circuit (IC) device includes logic circuitry and memory circuitry. The logic circuitry outputs a first clock signal and a control signal. The logic circuitry operates in a first power supply domain. The memory circuitry receives the first clock signal and one or more data signals. The memory circuitry includes clock signal generation circuitry, first integrated level shifter and latch circuitry, and bitcell circuitry. The clock signal generation circuitry receives the first clock signal and an isolation signal, and generates a second clock signal based the first clock signal and the isolation signal. The isolation signal corresponds to a power state of a power supply associated with the first clock signal. The first integrated level shifter and latch circuitry receives a first data signal of the one or more data signals in the first power supply domain, and latches a value of the first data signal based on the second clock signal. Further, the first integrated level shifter and latch circuitry outputs a first output signal in a second power supply domain different than the first power supply domain. The bitcell circuitry includes bitcells. A bitcell of the bitcells is updated based on the first output signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
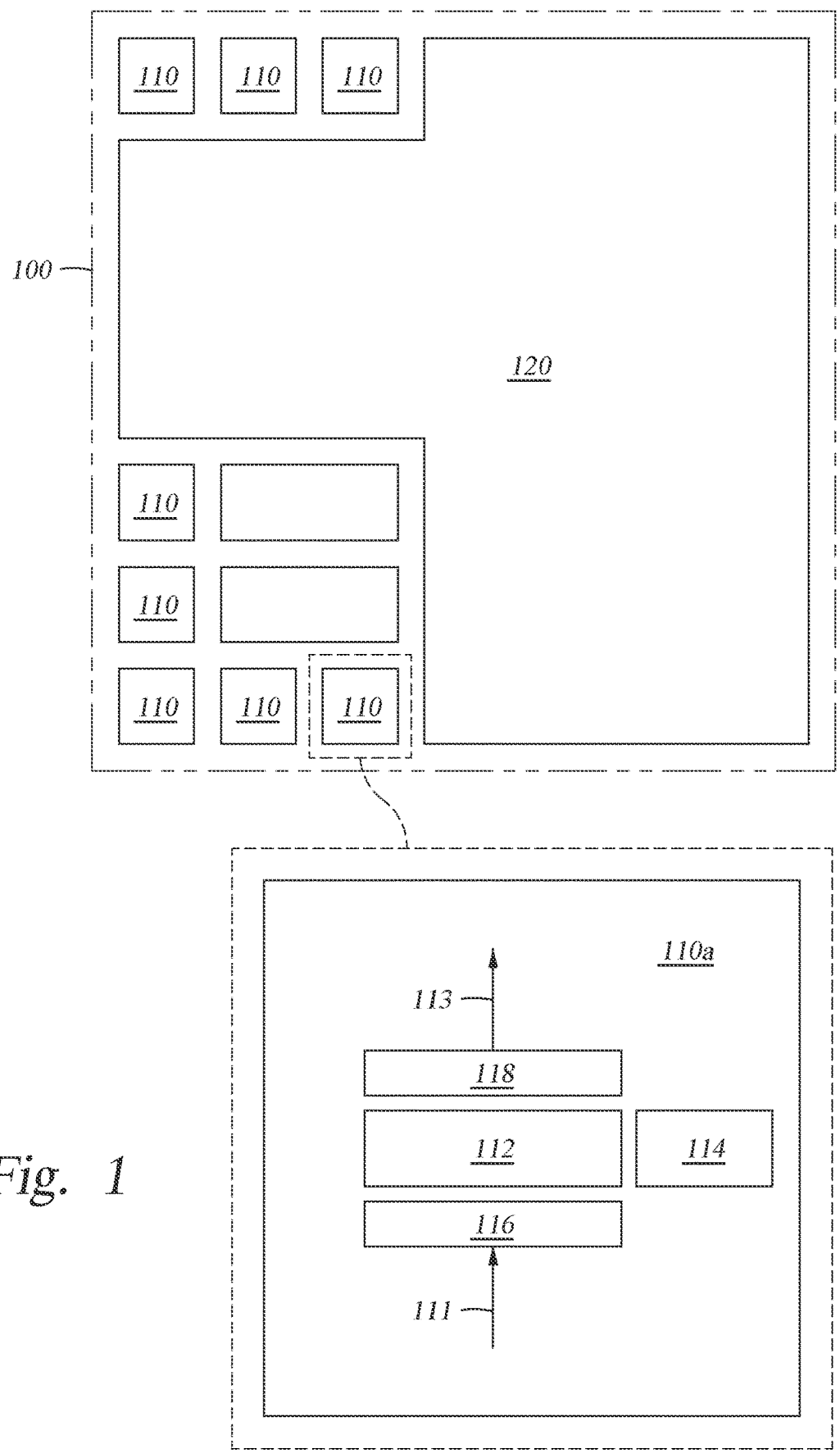
FIG. 1 illustrates a block diagram of an integrated circuit device in accordance with some embodiments of the present disclosure.

Aspects of the present disclosure relate to interface level shifter dual-rail memory architecture. An integrated circuit (IC) device includes one or more memory devices (e.g., memory instances). A memory device includes control circuitry and memory core circuitry. The control circuitry provides clock signals, row address signals, and column address signals, among others, to the memory core circuitry to update the bitcells (e.g., memory elements, memory banks, or memory core array) of the memory device. In one example, the control circuitry operates a lower power supply voltage (e.g., a lower voltage power supply domain) than that of the bitcells. Memory devices that include control circuitry and bitcells that operate in different power domains may be referred to as dual-rail (or dual-supply) devices.

Operating the control circuitry at lower power supply voltages reduces the amount of power used by the corresponding memory devices. However, as the bitcells and the control circuitry operate at different power supply voltages, signals provided to the bitcells from the control circuitry are shifted to the power supply voltage level of the bitcells. In one example, the signals are shifted before being received by the memory core circuitry coupled to the bitcells. In another example, the signals are shifted within memory core circuitry. In some instances, a portion of the signals are shifted by the memory core circuitry to reduce the amount of power used by the memory device.

Conventional memory devices include input level shifter circuits and latch circuits that are used when shifting signals between the different power supply domains. For example, a level shifter circuit and a latch circuit are used when transitioning the address and control signals received in a first power supply domain (e.g., VDDP or the power supply domain of the control circuitry) to a second power supply domain (VDDA or the power supply domain of the memory circuitry). Accordingly, the address and control signals that were communicated in the first power domain may be used by the elements of a memory device (e.g., bitcells) that operate in the second power supply domain. Further, a conventional memory device includes output latch circuits and level shifter circuits that are used to shift signals output from the memory devices from the second power supply domain to the first power supply domain. However, the use of the series latch circuits and level shifter circuits in the inputs and outputs of a memory device introduces performance delays and increases the circuit area of the memory devices.

The memory device described herein includes integrated level shifter and latch circuitry that shift signals between first and second power supply domains. The integrated level shifter and latch circuitry performs the functions of both a level shifter circuit and a latch circuit. For example, the integrated level shifter and latch circuitry transitions a signal between first and second power supply domains and also latches a state of the signal.

A memory device power downs (e.g., turns off) one or more power supplies to reduce the power used by the memory device. For example, a power supply associated with the first power supply voltage is turned off to reduce power used by the memory device. To ensure that turning off the power supply does not cause errors within the bitcells of the memory device (e.g., memory write errors), the integrated level shifter and latch circuitries latch the value of received data signals based on the latch clock signal. The latch clock signal is generated from a clock signal provided by control circuitry of the memory device or an isolation signal (e.g., a power isolation signal). The isolation signal indicates a power state of a power supply associated with the first power supply (e.g., powered on or powered off). As the latch clock signal is generated based on clock signal or the power isolation signal, when the clock signal is turned off based on the corresponding power supply being turned off, the integrated level shifter and latch circuitry is able to maintain a latch of the data, mitigating errors within the memory device.

The technical advantages of the present disclosure include, but are not limited to, using integrated level shifter and latch circuitry to shift signals between power supply domains, reducing the circuit area size of the corresponding IC device, and reducing the manufacturing cost of the memory device. Further, the integrated level shifter and latch circuitry as described herein mitigates errors within the memory device when powering off a power supply to reduce power usage of the IC device.

FIG. 1 illustrates an IC device 100, according to one or more examples. In one example, the IC device 100 is a System-on-Chip (SoC). Further, IC device 100 may be other types of IC devices (e.g., field programmable gate arrays (FPGAs), or application specific ICs (ASICs), among others). The IC device may include one or more IC chips. The IC device 100 includes logic circuitry (e.g., control circuitry) 120 and memory devices 110. The memory devices 110 are embedded memory instances within the IC device 100.

The logic circuitry 120 operates in a first power supply domain (e.g., VDDP). The memory devices 110 operate in the first power supply domain and a second power supply domain (VDDA). In one example, the voltage level of the second power supply domain differs from that of the first power supply domain. For example, the voltage level of the second power supply domain is less than that of the voltage level of the first power supply domain. As the voltage levels of the first and second voltage domains differ, the memory devices 110 may be referred to as operating in a dual-supply mode.

The memory device 110a is an example of the memory devices 110. The memory device 110a includes bitcell and periphery circuitry 112, test circuitry 114, and level shifter circuitry 116, and 118. The level shifter circuitry 116 is an input level shifter that receives input signals 111 (e.g., a clock signal, address signals, control signals, and/or data signals, among others). The input signal 111 are received from the logic circuitry 120. The input signals are received in a first power supply domain. The level shifter circuitry 116 shifts an input signal from the first power supply domain to the second power supply domain, and outputs the shifted input signals to the bitcell and periphery circuitry 112. In one or more examples, the level shifter circuitry 116 is integrated level shifter and latch circuitry that is configured to latch data within an input signal and also shift the input signal between power supply domains.

The level shifter circuitry 118 receives one or more outputs signals (e.g., data signals) from the bitcell and periphery circuitry 112, and shifts the output signals from the second power supply domain to the first power supply domain. The level shifter circuitry 118 outputs a shifted output signal to the logic circuitry 120. In one example, the shifted output signal includes data that corresponds to a memory read request of the input signal. In one or more examples, the level shifter circuitry 118 is an integrated level shifter and latch circuitry that is configured to latch data within an output signal and also shift the output signal between power supply domains.

The bitcell and periphery circuitry 112 includes one or more of decode circuitry, bitcell array elements, sense amplifier circuitry, and/or write driver circuitry, among others. In one or more examples, the bitcell and periphery circuitry 112 includes a plurality of bitcells that are disposed in rows and columns via wordlines and bitlines, respectively. Each of the bitcells includes one or more transistors. The bitcells are connected to the decoder circuitry via wordlines and connected to the sense amplifier circuitry and/or write driver circuitry via bitlines. A bitcell is read from or written to by activating the corresponding wordline and bitline. The bitcell and periphery circuitry 112 may further include pre-charge circuitry that drives the bitlines with precharge circuitry. Further, the bitcell and periphery circuitry 112 may include selection circuitry that selects one or more of the bitlines to be read from or written to.

The decode circuitry receives address information associated with a memory transaction (e.g., a read or write command) within input signals 111 received from the logic circuitry 120. The decoder circuitry determines and selects a row and a column (e.g., wordline and bitline) to read from or write to a corresponding bitcell.

For a read command, the sense amplifier circuitry is coupled to the selected bitcell via the selected bitline, and obtains and outputs a data value stored within the bitcell. For a write command, the write driver circuitry writes a data value to the selected bitcell.

The test circuitry 114 includes one or more integrated level shifter and latch circuitries, buffer circuitries, and/or scan chain circuit elements. The integrated level shifter and latch circuitries shift a received signal (e.g., an input data signal) to between power supply domains (e.g., between a first power supply domain and a second power supply domain), and an output signal between power supply domains (e.g., between a first power supply domain and a second power supply domain). Further, the integrated level shifter and latch circuitries latch a value of a received data signal based on a latch clock signal. The shift chain circuitry includes one or more latches that receive and output data signals based on a clock signal. The latches of the scan chains are loaded within bits of a data signal, and then the data within the scan chains are read out. The output data signal may be used to determine whether or not errors are present within the memory device.

Figure 2:
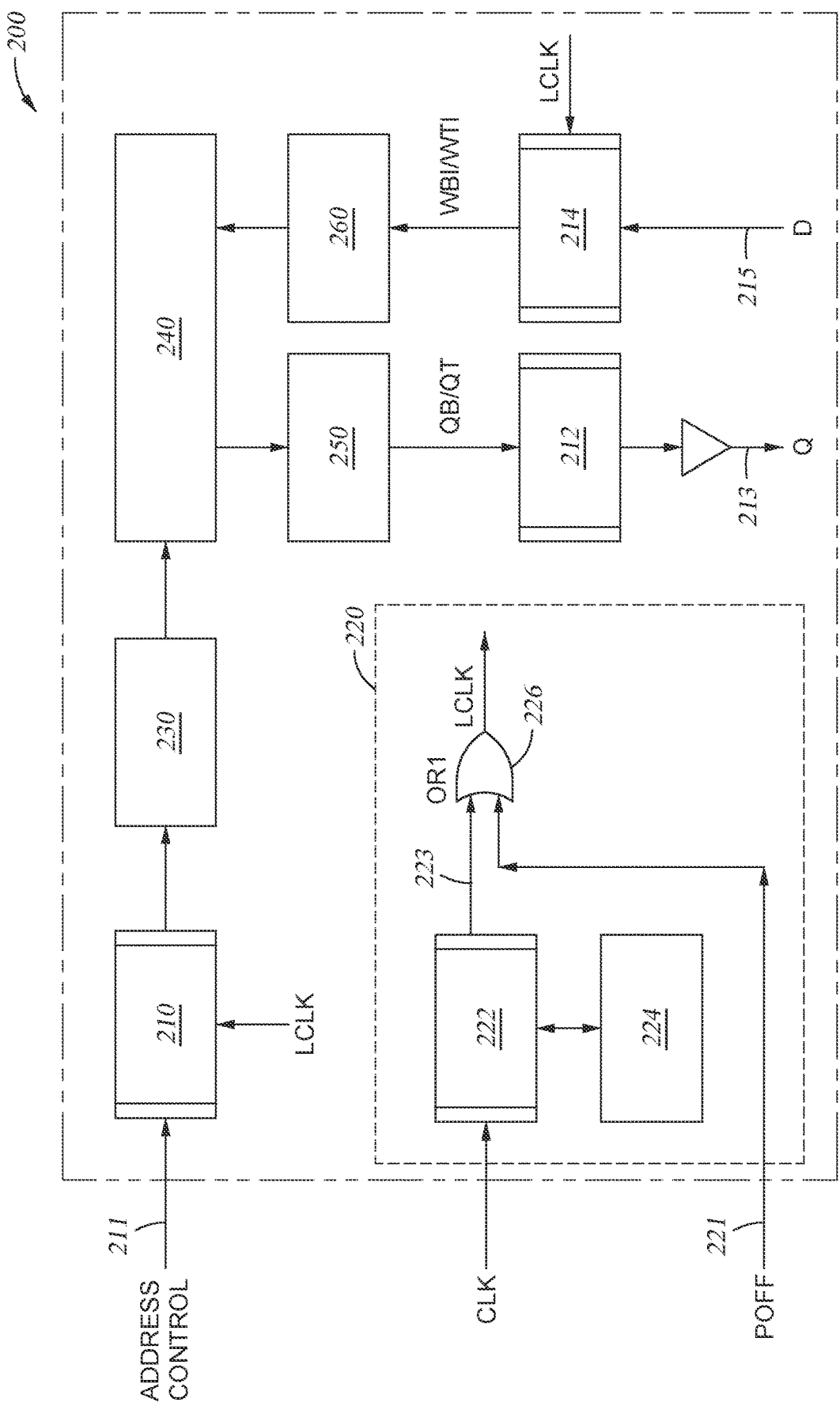
FIG. 2 illustrates a block diagram of a bitcell and periphery circuitry of a memory device in accordance with some embodiments of the present disclosure.

FIG. 2 illustrates a block diagram of a memory device 200, according to one or more examples. The memory device 200 includes integrated level shifter and latch circuitries 210, 212, and 214, clock generation circuitry 220, decoder circuitry 230, bitcell array 240, sense amplifier circuitry 250, and write driver circuitry 260.

The integrated level shifter and latch circuitry 210 receives an input signal 211 (e.g., address controls), converts the input signal 211 from a first power supply domain (e.g., VDDP) to a second power supply domain (e.g., VDDA). Further, the integrated level shifter and latch circuitry 210 latches a value of the input signal 211 based on the latch clock signal LCLK. The input signal 211 includes address data of a memory command. The input signal 211 may be a control signal received from logic circuitry of a corresponding IC device (e.g., the logic circuitry 120 of the IC device 100 of FIG. 1).

The memory command may be a read command or a write command. The output of the integrated level shifter and latch circuitry 210 is received by the decode circuitry 230. For example, the integrated level shifter and latch circuitry 210 outputs address data in the second power supply domain to the decode circuitry 230. The decode circuitry 230 functions as described above to determine a row and column within the bitcell array 240 to activate, to select a corresponding bitcell associated with address data.

The sense amplifier circuitry 250 obtains data from the selected bitcell of the bitcell array 240. The sense amplifier circuitry 250 obtains (e.g., reads data) based on the corresponding memory command being a read command. The data is in the second power supply domain. The data is received by the integrated level shifter and latch circuitry 212. The integrated level shifter latch and latch circuitry 212 latches the data and shifts the data from the second power domain to the first power supply domain. The data is output as the signal 213 (Q) from the memory device in the first power supply domain.

The write driver circuitry 260 writes data to a selected bitcell of the bitcell array 240. The write driver circuitry 260 obtains the data to be written from the integrated level shifter and latch circuitry 214. The data is received by the write driver circuitry 260 in the second power supply domain.

The integrated level shifter and latch circuitry 214 receive the data signal 215 (D) in the first power supply domain from logic circuitry (e.g., the logic circuitry 120 of FIG. 1), and shifts the data signal 215 from the first power supply domain to the second power supply domain. The integrated level shifter and latch circuitry 214 latches data of the data signal 215 based on the latch clock signal LCLK.

In the memory device 200, the decode circuitry 230, the bitcell array 240, the sense amplifier circuitry 250, and the write driver circuitry 260 operate within the second power supply domain. The integrated level shifter and latch circuitries 210, 212, and 214 operate in both the first power supply domains and the second power supply domain.

The clock generation circuitry 220 generates the latch clock signal LCLK. The clock generation circuitry 220 generates the latch clock signal LCLK based on the clock signal CLK and the isolation signal (e.g., power isolation signal (POFF)) 221. The clock signal CLK is provided by the logic circuitry 120 of FIG. 1. Further, the isolation signal 221 is provided by the logic circuitry 120.

The clock generation circuitry 220 includes level shifter circuitry 222, clamping circuitry 224, and combinatorial circuitry (or logic) 226. The level shifter circuitry 222 receives the clock signal CLK and outputs the signal 223 (e.g., a voltage level shifted clock signal). The clamping circuitry 224 latches a value of the clock signal CLK. The clock signal CLK is in a first power supply domain. The level shifter circuitry 222 shifts the clock signal CLK from the first power supply domain to the second power supply domain, generating the signal 223. The signal 223 is in the second power supply domain.

As compared to the level shifter circuits and latch circuits of a conventional memory device, the integrated level shifter and latch circuitries 210, 212, and 214 used within the memory device 200 reduce the overall circuit area of the memory device 200, reducing the corresponding manufacturing cost of the memory device 200. For example, the latch circuits connected to the level shifter circuits of a conventional memory device are omitted in the memory device 200, as the memory device 200 incorporates integrated level shifter and latch circuitries.

The isolation signal 221 indicates a power state of a power supply associated with the first supply voltage domain (e.g., powered on or powered off). In one example, the isolation signal 221 indicates whether or not the power supply associated with the first supply voltage domain has been powered off. For example, the power supply associated with the first supply voltage domain is powered off by the logic circuitry 120 of FIG. 1 to reduce power used by the logic circuitry 120. In one example, based on the power supply associated with the first supply voltage domain being powered off, the voltage value of the isolation signal 221 is activated (e.g., a high voltage value or a low voltage value). Further, when the power supply associated with the first supply voltage domain is turned off, the clock signal CLK is stopped.

The combinatorial circuitry 226 receives the signal 223 and the isolation signal 221, and generates the latch clock signal LCLK. In one example, the combinatorial circuitry 226 is an OR logic gate. In other examples, the combinatorial circuitry 226 is other types of logic gates. In one example, when the power supply associated with the first power supply domain is turned off, one or more of the integrated level shifter and latch circuitry 210 and 214 may experience an unknown input level. Accordingly, errors may be introduced within the data of the bitcells of the bitcell array and periphery circuitry. In an example, where the integrated level shifter and latch circuitries 210 and/or 214 receive and operate based on the clock signal CLK, when the power supply associated with the first power supply domain is turned off, and the clock signal CLK is no longer available. Accordingly, the level shifter and latch circuitries 210 and/or 214 may experience operational errors.

In one example, the latch clock signal LCLK is forced to a high voltage value during power-down modes (e.g., power off of the power supply associated with the first power supply domain) as indicated by the isolation signal 221 to provide isolation of input data at the input of the integrated level shifter and latch circuitries 210 and 214. The latched state of the integrated level shifter and latch circuitries 210 and 214 is leveraged to provide input isolation during power-down modes. In one example, the latch clock signal LCLK has a high voltage value based on the isolation signal 221 having a high voltage value, indicating that the power supply associated with the first power supply domain being turned off (e.g., has a powered off power state). Further, the latch clock signal LCLK follows the clock signal CLK (e.g., transitions between a high voltage value and a low voltage value) based on the isolation signal 221 having a low voltage value.

As the latch clock signal LCLK is generated based on either the clock signal CLK or the isolation signal 221, the latch clock signal LCLK is available regardless if the clock signal CLK is available or not. In an example where the clock signal CLK has been stopped based on the power supply associated with the first power supply domain being turned off, the latch clock signal LCLK is generated (e.g., maintained at a voltage level) based on the isolation signal 221, which is active based on the power supply associated with the first power supply domain being turned off. Accordingly, as power supplies are cycled on and off for power savings, the clock generation circuitry 220 generates the latch clock signal LCLK.

Figure 3:
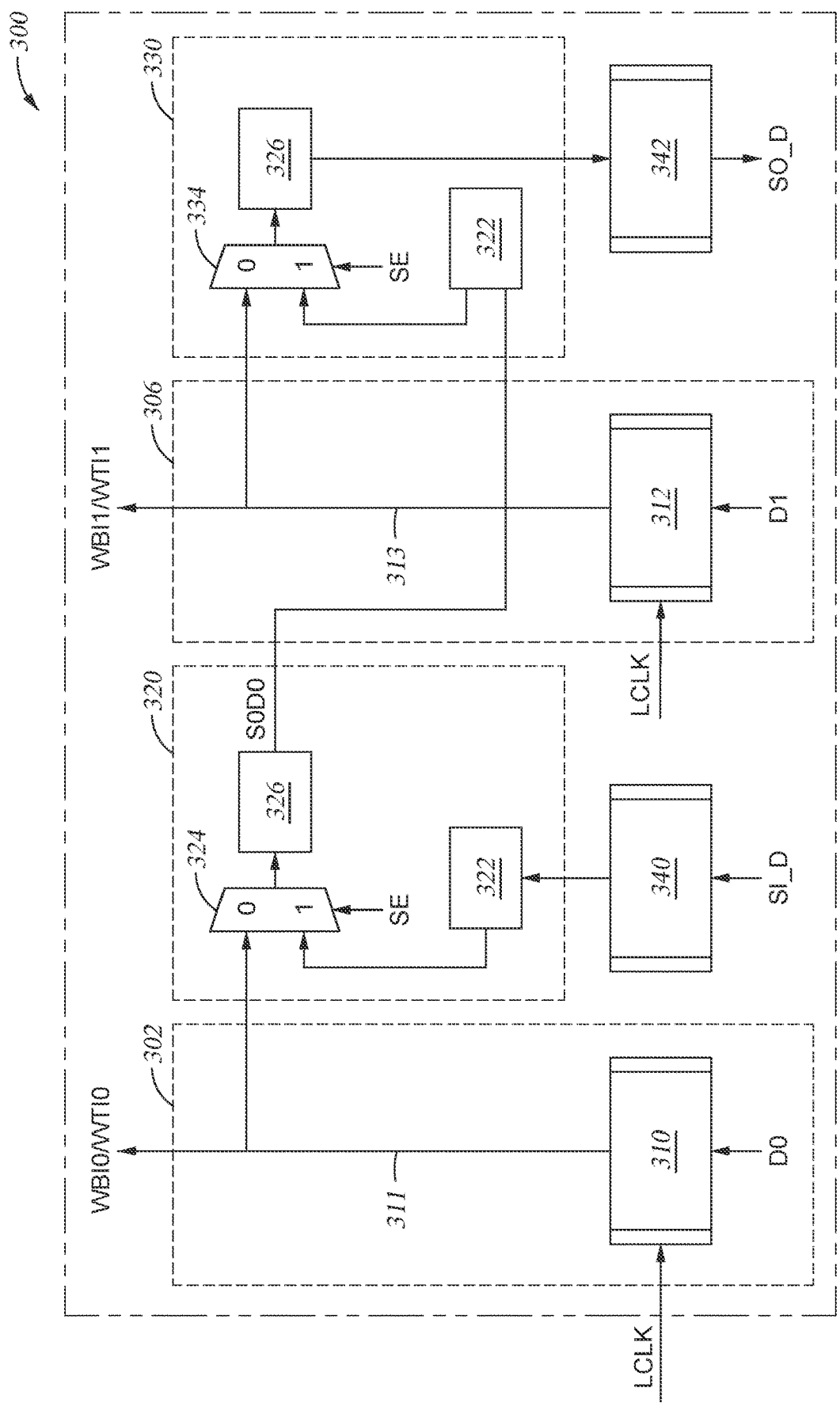
FIG. 3 illustrates a block diagram of testing circuitry of a memory device in accordance with some embodiments of the present disclosure.

FIG. 3 illustrates test circuitry 300 for a memory device, according to one or more examples. The test circuitry 300 includes integrated level shifter and latch circuitries 310 and 312 that reduce the circuit area of the test circuitry 300, and manufacturing cost of the corresponding memory device, as compared to a conventional test circuitry of a memory device.

The test circuitry 300 further includes level shifter circuitries 340 and 342, and scan chain circuitries 330 and 240. The scan chain circuitry 320 forms a first scan chain path and the scan chain circuitry 330 forms a second scan chain path. The integrated level shifter and latch circuitry 310 forms a first functional path and the integrated level shifter and latch circuitry 312 forms a second functional path.

The integrated level shifter and latch circuitry 310 receives a data signal DO from logic circuitry (e.g., the logic circuitry 120 of FIG. 1) based on the latch clock signal LCLK. The latch clock signal LCLK is generated by the clock generation circuitry 220 of FIG. 2. The integrated level shifter and latch circuitry 310 receives the data signal DO in the first power supply domain, shifts the data signal DO from the first power supply domain to the second power supply domain, generating the data signal 311. The integrated level shifter and latch circuitry 310 latches the data signal DO based on the latch clock signal LCLK. The data signal 311 corresponds to the latched value.

The scan chain circuitry 320 receives the data signal 311 (WBI0/WTI0) from the integrated level shifter and latch circuitry 310 and the signal SIO from the level shifter circuitry 340. In one example, the level shifter circuitry 340 receives the data signal SI_D from logic circuitry (e.g., the logic circuitry 120 of FIG. 1), and shifts the data signal SI_D from a first power supply domain to a second power supply domain, generating the data signal SIO. The scan chain circuitry 320 includes latch circuitry 322, multiplexer circuitry 324, and latch circuitry 326. The latch circuitry 322 receives and latches data of the data signal SIO. A first input of the multiplexer circuitry 324 receives the data signal 311 and a second input of the multiplexer circuitry 324 receives the output of the latch circuitry 322. The multiplexer circuitry 324 selects one of the data signal 311 and the output of the latch circuitry 322 based on the selection signal SE. The output of the multiplexer circuitry 324 is connected to the latch circuitry 326.

The integrated level shifter and latch circuitry 312 receives a data signal D1 from logic circuitry (e.g., the logic circuitry 120 of FIG. 1) based on the latch clock signal LCLK. The latch clock signal LCLK is generated by the clock generation circuitry 220 of FIG. 2. The integrated level shifter and latch circuitry 312 receives the data signal D1 in the first power supply domain, and shifts the data signal D1 from the first power supply domain to the second power supply domain, generating the data signal 313 (WBI1/WTI1). The integrated level shifter and latch circuitry 312 latches the data signal D1 based on the latch clock signal LCLK.

The scan chain circuitry 330 receives the data signal 313 from the integrated level shifter and latch circuitry 312 and the signal S0D0 from the scan chain circuitry 320. The scan chain circuitry 330 includes latch circuitry 332, multiplexer circuitry 334, and latch circuitry 336. The latch circuitry 332 receives and latches data of the data signal S0D0. A first input of the multiplexer circuitry 334 receives the data signal 313 and a second input of the multiplexer circuitry 334 receives the output of the scan chain circuitry 320. The multiplexer circuitry 334 selects one of the data signal 313 and the output of the scan chain circuitry 320 based on the selection signal SE. The output of the multiplexer circuitry 334 is connected to the latch circuitry 336. The latch circuitry 336 outputs the data signal S0D1, which is received by the level shifter circuitry 342.

The level shifter circuitry 342 receives the data signal S0D1 in the second power supply domain, and shifts the data signal S0D1 from the second power supply domain to the first power supply domain, generating the data signal S0_D. The data signal S0_D is output in the first power supply domain. In one example, the data signal S0_D is output to the logic circuitry 120 of FIG. 1, and used to determine whether or not errors are present within the memory device (e.g., the memory device 110a of FIG. 1).

Incorporating the integrated level shifter and latch circuitries 310 and 312 within the test circuitry 300 reduces the circuit area and improve the performance of the test circuitry 300, as compared to conventional testing circuitry. In one or more examples, the use of the integrated level shifter and latch circuitries 310 and 312 reduce the circuit area of the test circuitry 300 as multiplexers, which are included in conventional testing circuitry, are omitted from the corresponding functional paths. Further, in test circuitry 300, the latch circuitries 322 and 332 are separate from the functional paths 302 and 306 that are used during the scan operation. In one example, during the scan operation, the latch circuitries 322 and 332 capture data. The multiplexer circuitries 324 and 334 are controlled by the scan enable signal (SE) pin. When the SE pin is set to 0, data output from the integrated level shifter and latch circuitries 310 and 312 is output by the multiplexer circuitries 324 and 334, respectively. Further, during a shift operation, when the SE pin is set to 1, the outputs of the latch circuitries 322 and 332 are selected by the multiplexer circuitries 324 and 334, respectively.

Figure 4:
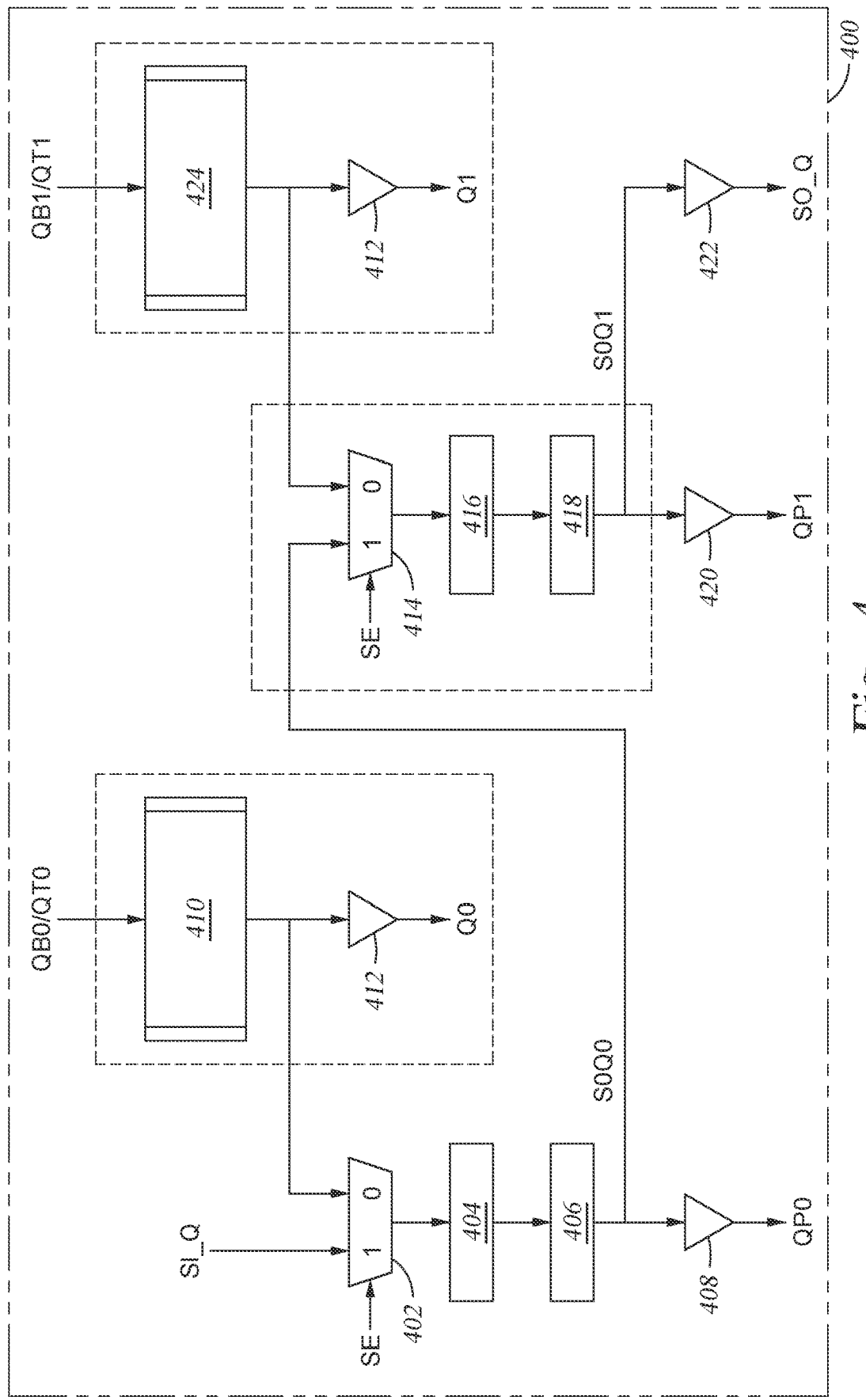
FIG. 4 illustrates a block diagram of testing circuitry of a memory device in accordance with some embodiments of the present disclosure.

FIG. 4 illustrates memory output scan chain test circuitry 400, according to one or more examples. In one example, the output scan chain test circuitry 400 is included within the test circuitry 114 of FIG. 1. Further, the output scan chain test circuitry 400 is connected to the output of the test circuitry 300 of FIG. 1. As compared to a conventional memory output scan chain test circuitry, the memory output scan chain test circuitry 400 includes integrated level shifter and latch circuitries 410 and 424, reducing the circuit area of the memory output scan chain test circuitry 400 as compared to the conventional memory output scan chain test circuitry. Further, in the memory output scan chain test circuitry 400, the data output from the integrated level shifter and latch circuitries 410 and 424 is used as an input to the scan chains. Accordingly, additional level shifters in the corresponding data paths may be omitted, as compared to a conventional memory output scan chain test circuitry.

The memory output scan chain test circuitry 400 includes a multiplexer 402 having a first input that receives the signal SI_Q and a second input that is connected to the output of the integrated level shifter and latch circuitry 410. The output of the multiplexer 402 is connected to an input of the latch circuit 404, and an output of the latch circuit 404 is connected to an input of the latch circuit 406. The output of the latch circuit 406 is connected to the buffer 408 and a first input of the multiplexer 414. The buffer 408 outputs the signal QP0. Further, the multiplexer 402, the latch circuit 404, the latch circuit 406, and the buffer 408 are in the first power supply domain.

The integrated level shifter and latch circuitry 410 receives the data signal QB0/BT0 from logic circuitry (e.g., the logic circuitry 120 of FIG. 1), and shifts the data signal QB0/QT0 from the second power supply domain to the first power supply domain. The output of the integrated level shifter and latch circuitry 410 is connected to the buffer 412 that outputs the signal Q0. The buffer 412 is in the first power supply domain. The integrated level shifter and latch circuitry 410 and the buffer 412 are part of a functional path.

The multiplexer 414 has a first input that is connected to the output of the latch circuit 406 and a second input that is connected to the output of the integrated level shifter and latch circuitry 424 via the buffer 426. The output of the multiplexer 414 is connected to an input of the latch circuitry 416, and an output of the latch circuitry 416 is connected to an input of the latch circuitry 418. The output of the latch circuitry 418 is connected to the buffer 420 and the buffer 422. The multiplexer 414, the latch circuitry 416, and the latch circuitry 418 are part of a scan path chain circuit (e.g., a scan chain path). The buffer 420 outputs the signal QP1, and the buffer 422 outputs the signal S0_Q based on the signal S0Q1 output by the latch circuitry 418. Further, the multiplexer 414, the latch circuitry 416, the latch circuitry 418, the buffer 420, and the buffer 422 are in the first power supply domain.

The integrated level shifter and latch circuitry 424 receives the signal QB1/BT1 and shifts the signal QB1/BT1 from the second power supply domain to the first power supply domain. The output of the integrated level shifter and latch circuitry 424 is connected to the buffer 426 that outputs the signal Q1. The buffer 426 is in the first power supply domain. The integrated level shifter and latch circuitry 424 and the buffer 426 are part of a functional path. The circuit elements within the functional path perform normal operational functions of the memory device in both a test mode and a normal operation mode, while the circuit elements of the scan chain circuitry may be used for testing the operation of the memory device in a test mode, and for normal memory operation during a normal operation mode.

Figure 5:
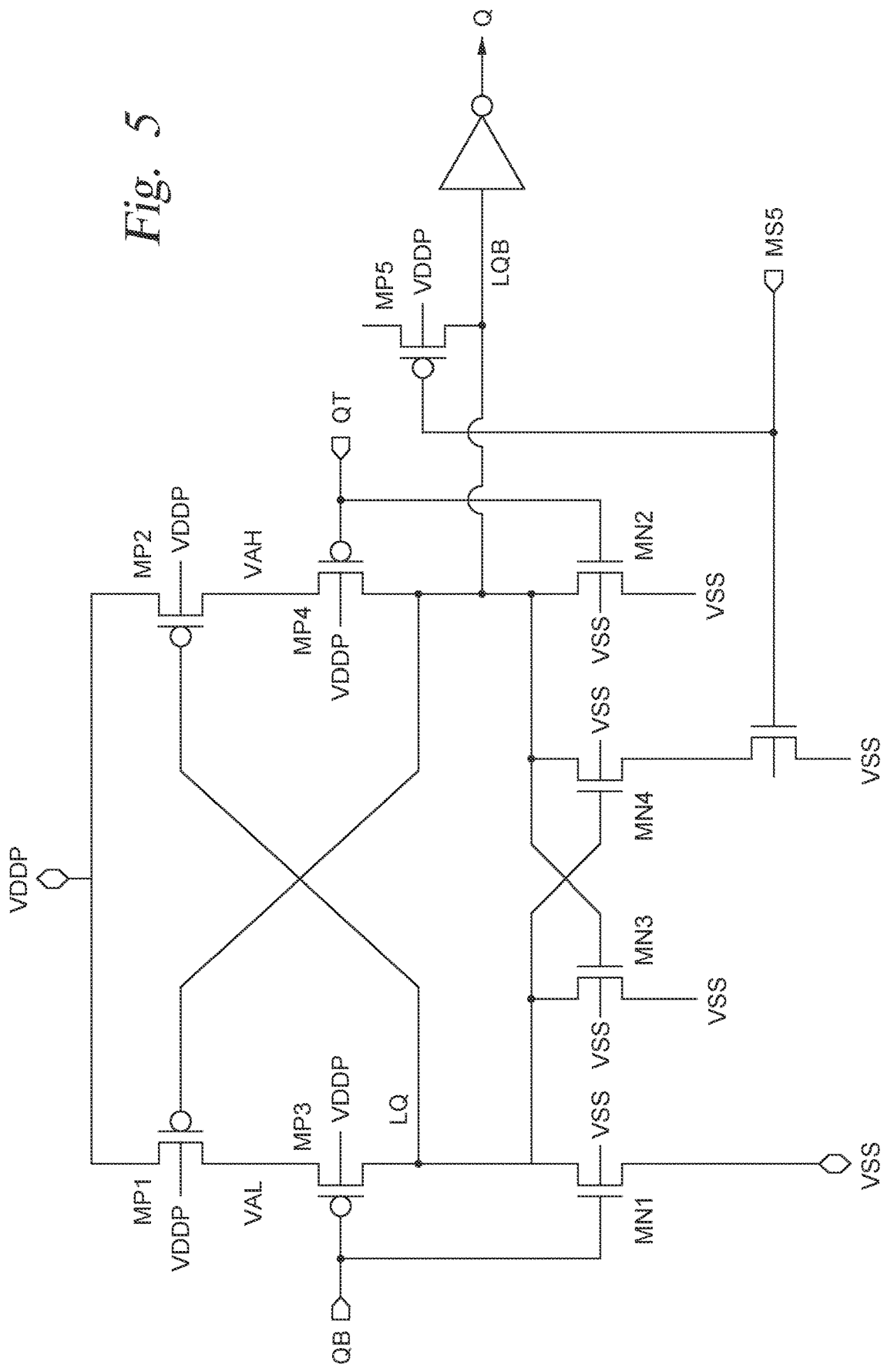
FIG. 5 illustrates a circuit diagram of integrated level shifter and latch circuitry in accordance with some embodiments of the present disclosure.

FIG. 5 is a schematic diagram of an integrated level shifter and latch circuitry 500, according to one or more example. The integrated level shifter and latch circuitries 212 of FIG. 2 and 410 and 424 of FIG. 4 may be configured similar to the integrated level shifter and latch circuitry 500. The output latch data inputs QT and QB are in the second power supply domain (e.g., VDDA). The output LQB is in the first power supply domain (e.g., VDDP).

Figure 6:
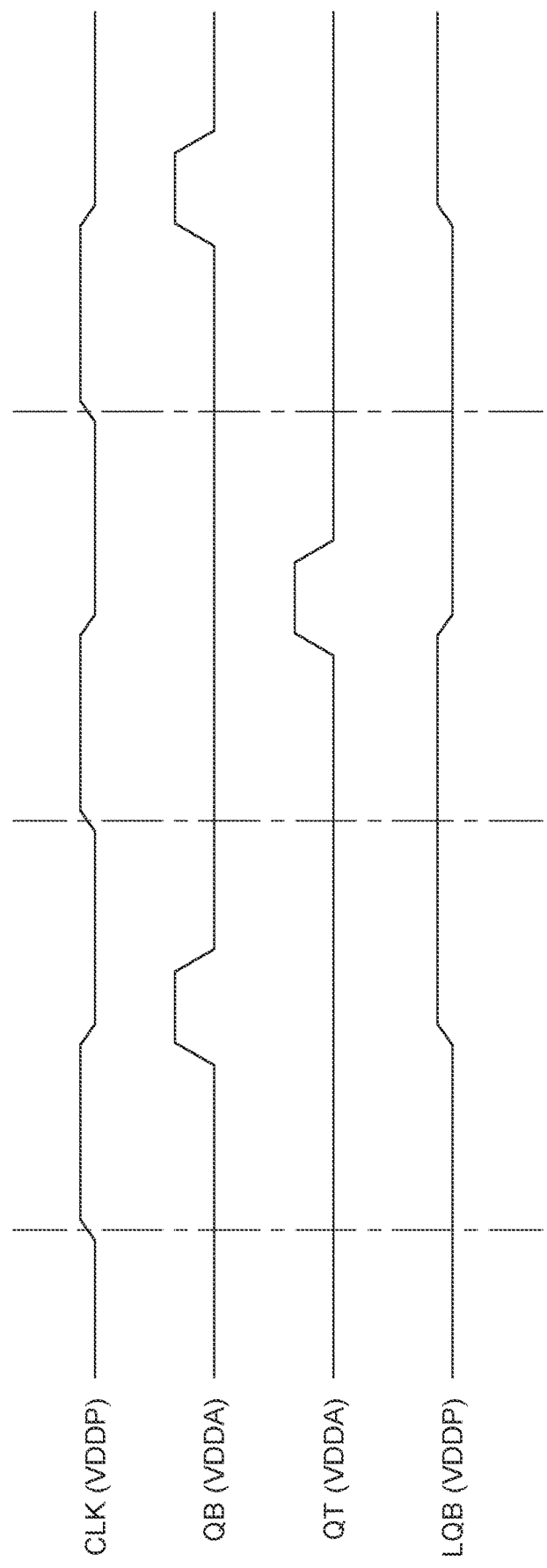
FIG. 6 illustrates a timing diagram of a waveform of the integrated level shifter and latch circuitry of FIG. 5.

FIG. 6 illustrates waveforms of the clock signal CLK, the input signal QB, the input signal QT, and the output signal LQB. The clock signal CLK and the output signal LQB are in the first power supply domain (e.g., VDDP). The input signal QB and the input signal QT are in the second power supply domain (e.g., VDDA).

Inputs QT and QB are complementary inputs. For a READ-1 operation, QT pulses to a value of 1 while QB remains at the voltage value VSS. For a READ-0 operation, QB pulses to value of 1 while QT remains at the voltage value VSS.

The transistors MP1, MP2, MP3, MP4, and MP5 are p-channel metal-oxide-semiconductor (PMOS) transistors. The transistors MN1, MN2, MN3, MN4, and MN5 are n-channel metal-oxide-semiconductor (NMOS) transistors. The transistors MP1, MP3, MN1, and MN3, and the transistors MP2, MP4, MN2, and MN4 form two NOR gates of a cross-coupled NOR structure. The cross-coupled NOR structure shifts the input signal from the second power supply domain to the first power supply domain.

The integrated level shifter and latch circuitry 500 includes cross-coupled PMOS transistors MP1, MP2, MP3, and MP4 and cross-coupled NMOS transistors MN3 and MN4. The cross-coupled PMOS transistors MP1, MP2, MP3, and MP4 level shift an input signal (e.g., input signal QB and input signal QT). The cross-coupled NMOS transistors MN3 and MN4 latch the value of on the cross-coupled PMOS transistors.

The integrated level shifter and latch circuitry 500 further includes transistors MN5 and MP5, which function to place a known voltage on the signal LQB. The transistors MN5 and MP5 are clamping transistors. During a power-down mode of the power supply associated with the second power supply domain, the clamping signal CLAMPB has a value of 0 (e.g., a low voltage value) to drive LQB to the first power supply domain and the signal Q to VSS. Based on the clamping signal CLAMPB having a low value, the transistor MN5 breaks the VSS feedback on the signal LQB so transistor MP5 is able to pull LQB to the voltage value VDDP without contention.

In one example, during a READ-1 mode, the signal QT pulses high (e.g., has a high voltage value) and the signal QB stays low (e.g., has a low voltage value). The transistors MP1 and MP3 reinforce the high voltage on node LQ. The transistors MP1, MP2, MP3, and MP4 shift the input signal from the second power supply domain to the first power supply domain.

Based on the QT signal returning to ground (e.g., a voltage value of 0 or a low voltage value), the value of LQB is latched by the cross-coupled PMOS transistors MP1 and MP2 and the cross-coupled NMOS transistors MN3 and MN4.

The integrated level shifter and latch circuitry 500 function as a level shifter, latch circuit and a clamping circuit.

Figure 7:
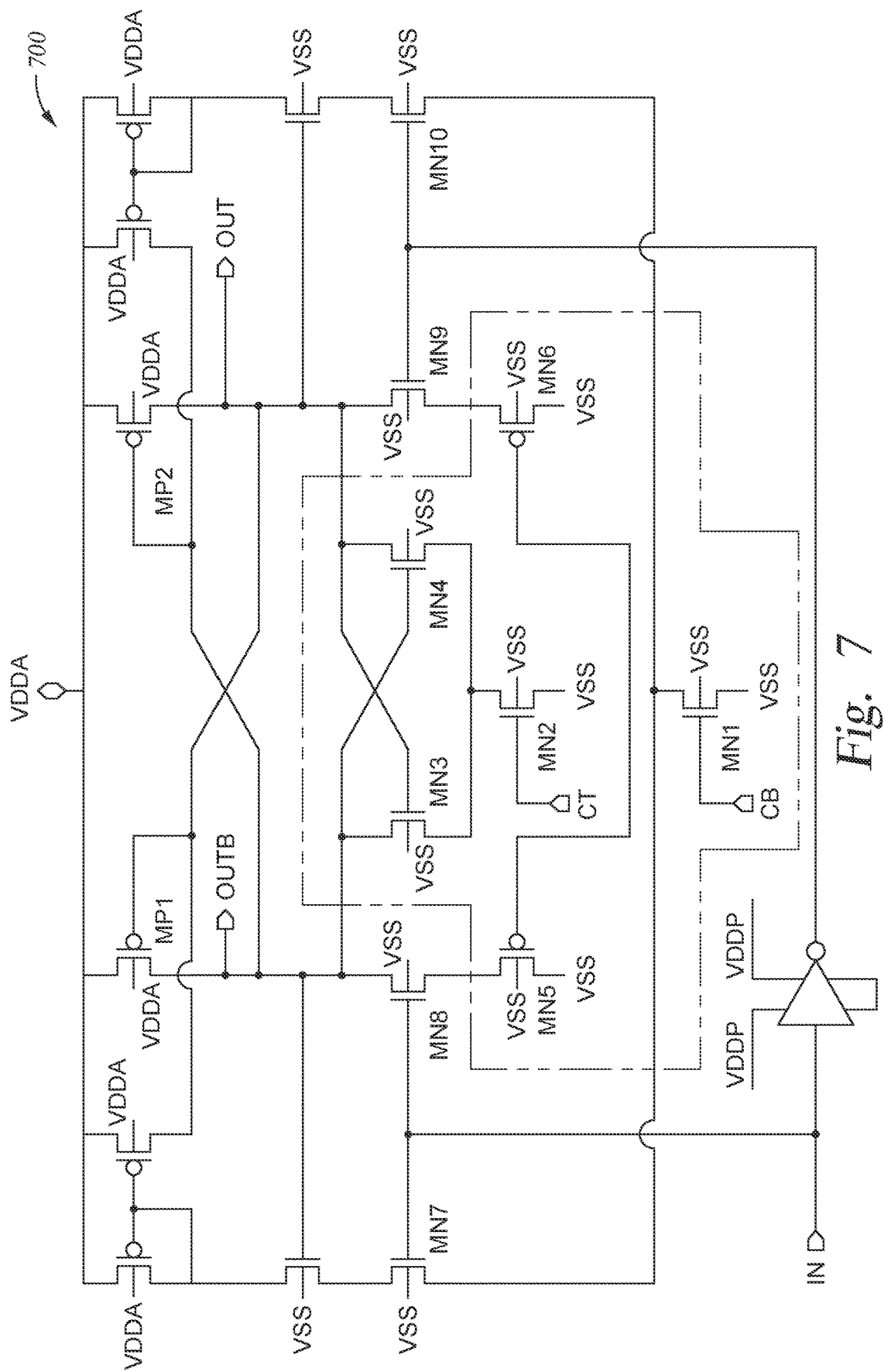
FIG. 7 illustrates a circuit diagram of integrated level shifter and latch circuitry in accordance with some embodiments of the present disclosure.

FIG. 7 illustrates the integrated level shifter and latch circuitry 700. The integrated level shifter and latch circuitry 700 shifts a signal from a first power supply domain to a second voltages supply domain. The integrated level shifter and latch circuitries 210 and 214 of FIG. 2, 310 and 312 of FIG. 3 may be configured similar to the integrated level shifter and latch circuitry 700. Further, the integrated level shifter and latch circuitry 700 latches the value of the level shifted input signal. The NMOS transistors MN2-MN4 and PMOS transistors MP1 and MP2 perform the latching function.

Figure 8:
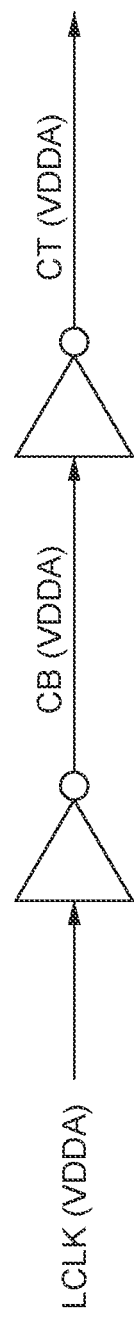
FIG. 8 illustrates circuit diagram of a clock generation circuit in accordance with some embodiments of the present disclosure.
Figure 10:
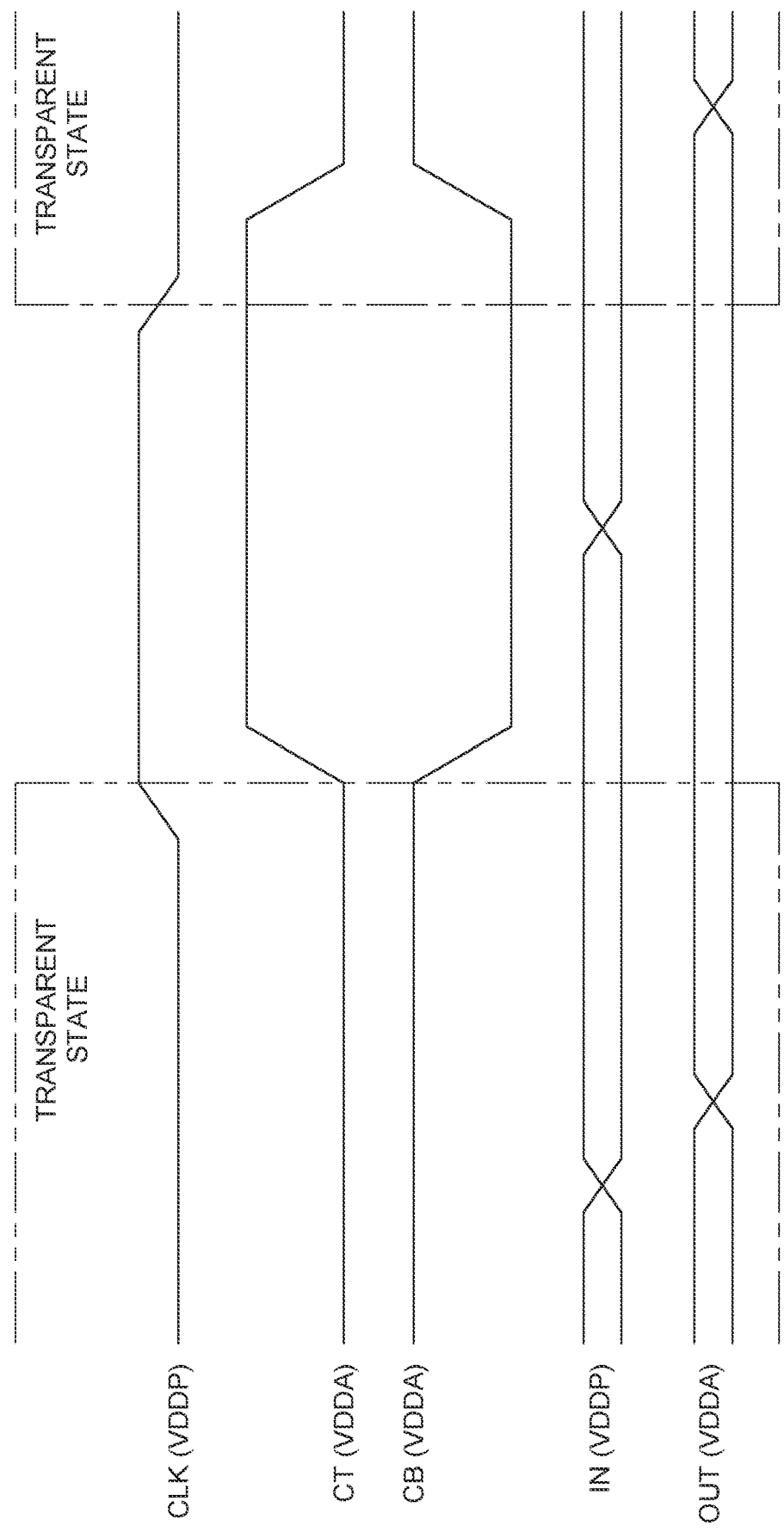
FIG. 10 illustrates a timing diagram of a waveform of the integrated level shifter and latch circuitry of FIG. 9.

The latching function is based on the latch clock signal LCLK. The latch clock signal LCLK is in the second voltage signal domain (e.g., VDDA). The latch clock signal LCLK is generated from the clock signal CLK. The clock signal CLK is depicted in FIG. 10. The latch clock signal LCLK drives the complementary clock signal CB and CT. The clock signals CB and CT are generated by inverting the latch clock signal LCLK to generate the clock signal CB, and inverting the clock signal CB to generate the clock signal CT, as illustrated by FIG. 8. The clock signal CB and CT drives the transistors of integrated level shifter and latch circuitry 700 to enable the latch function or to break the active path of the level shifter to isolate the inputs from the outputs.

Figure 9:
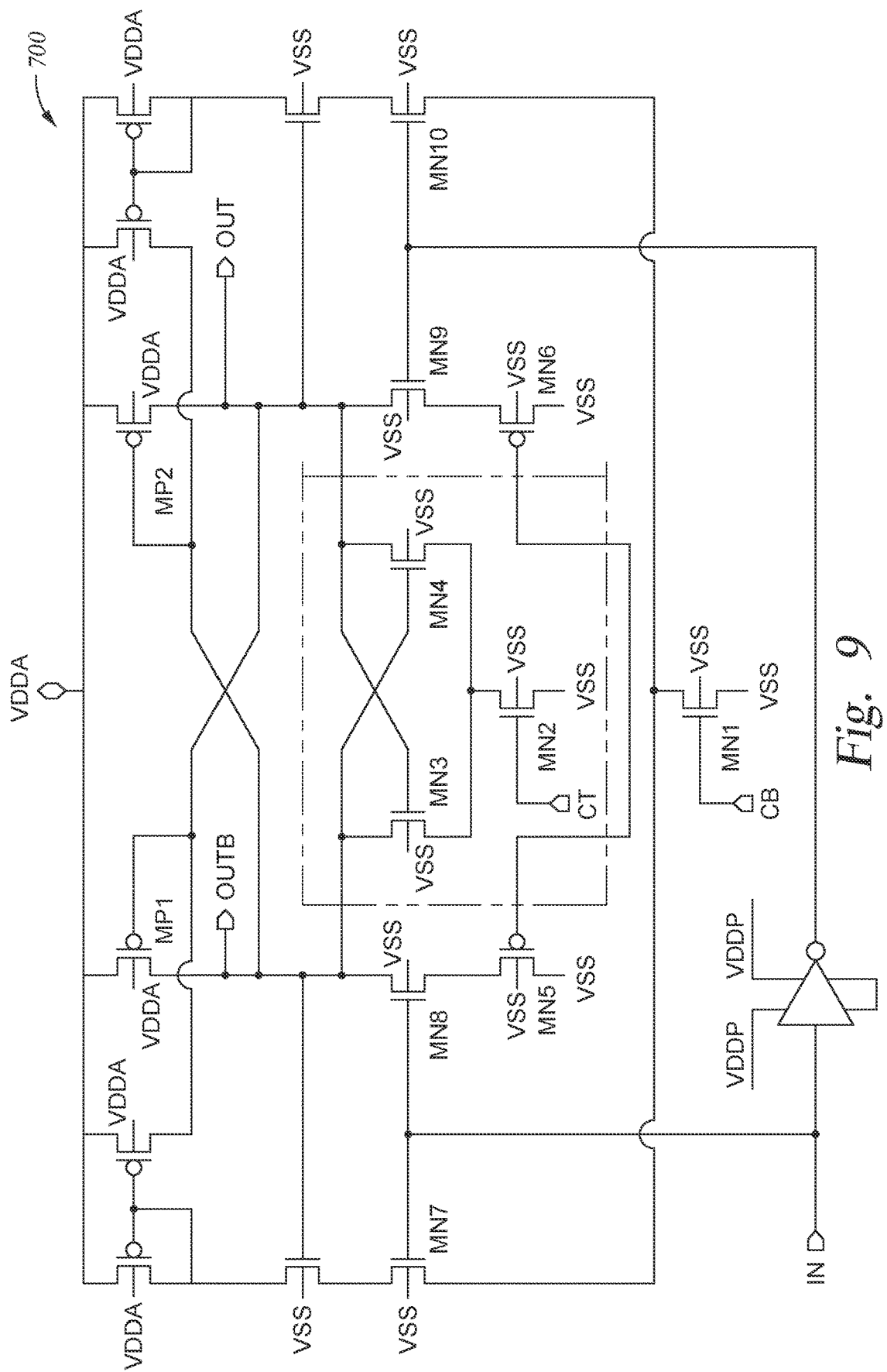
FIG. 9 illustrates a circuit diagram of integrated level shifter and latch circuitry in accordance with some embodiments of the present disclosure.

In the transparent mode, when the integrated level circuit and latch circuitry 700 are integrated within elements of a memory device (e.g., as illustrated by FIGS. 2, 3, and 4), the memory is waiting address and control signals before being latched. Further, in the transparent mode, the latch clock signal LCLK has a low voltage value (e.g., a 0 value). Further, the clock signal CT as a low voltage value and the clock signal CB has a high voltage value. FIG. 9 illustrates the integrated level shifter and latch circuitry 700 in a transparent mode and FIG. 10 illustrates the waveforms of the clock signals CLK, CB, CT, the input signal IN, and the output signal OUT in a transparent mode. The cross-coupled NMOS latch (e.g., the NMOS transistors MN3 and MN4) are disabled by the NMOS transistor MN2 being driven with the clock signal CT having a low voltage value. The level shifter evaluation transistors MN7-MN10 are enabled by the NMOS transistors MN1, MN5 and MN6 being driven with the clock signal CB having a high value. In this mode, the level shifter operates asynchronously with respect to the input data. The input signal IN is at the first power supply domain and the complementary output signals (e.g., the output signal OUT, OUTB) are switched to the second power supply domain.

The waveforms corresponding to the transparent state are shown in FIG. 10. In one example in the transparent state, the input signal IN is shifted from the first voltage supply node to the output signal OUT at the second voltage supply node. The transistor MN1 is driven with the clock signal CB. The transistor MN1 ensures that the legs (e.g., the transistors MN7, MN8, MN6, and MN10) are sourced with a ground signal, enabling proper function of the level shift circuitry.

Figure 11:
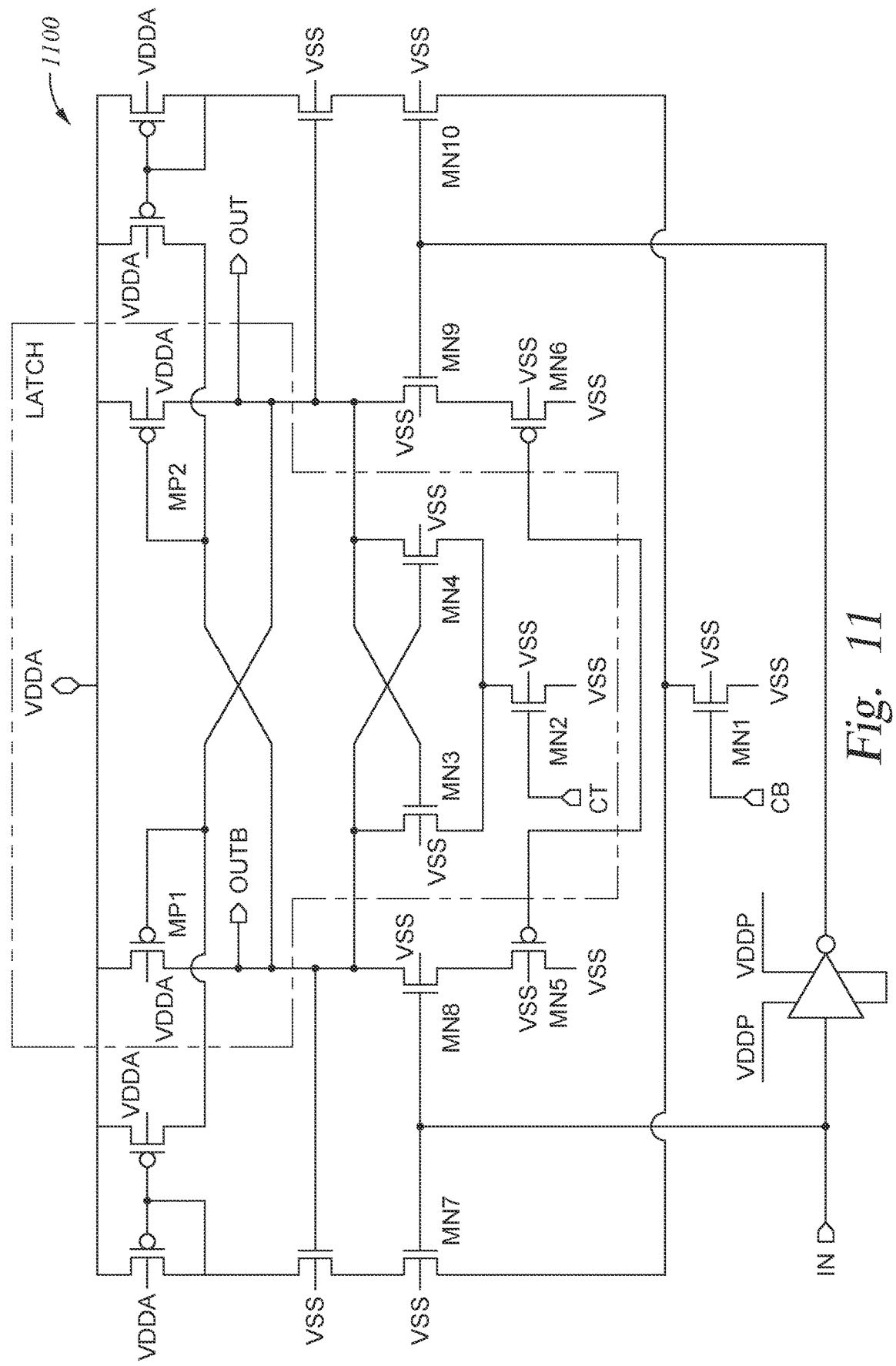
FIG. 11 illustrates a circuit diagram of integrated level shifter and latch circuitry in accordance with some embodiments of the present disclosure.
Figure 12:
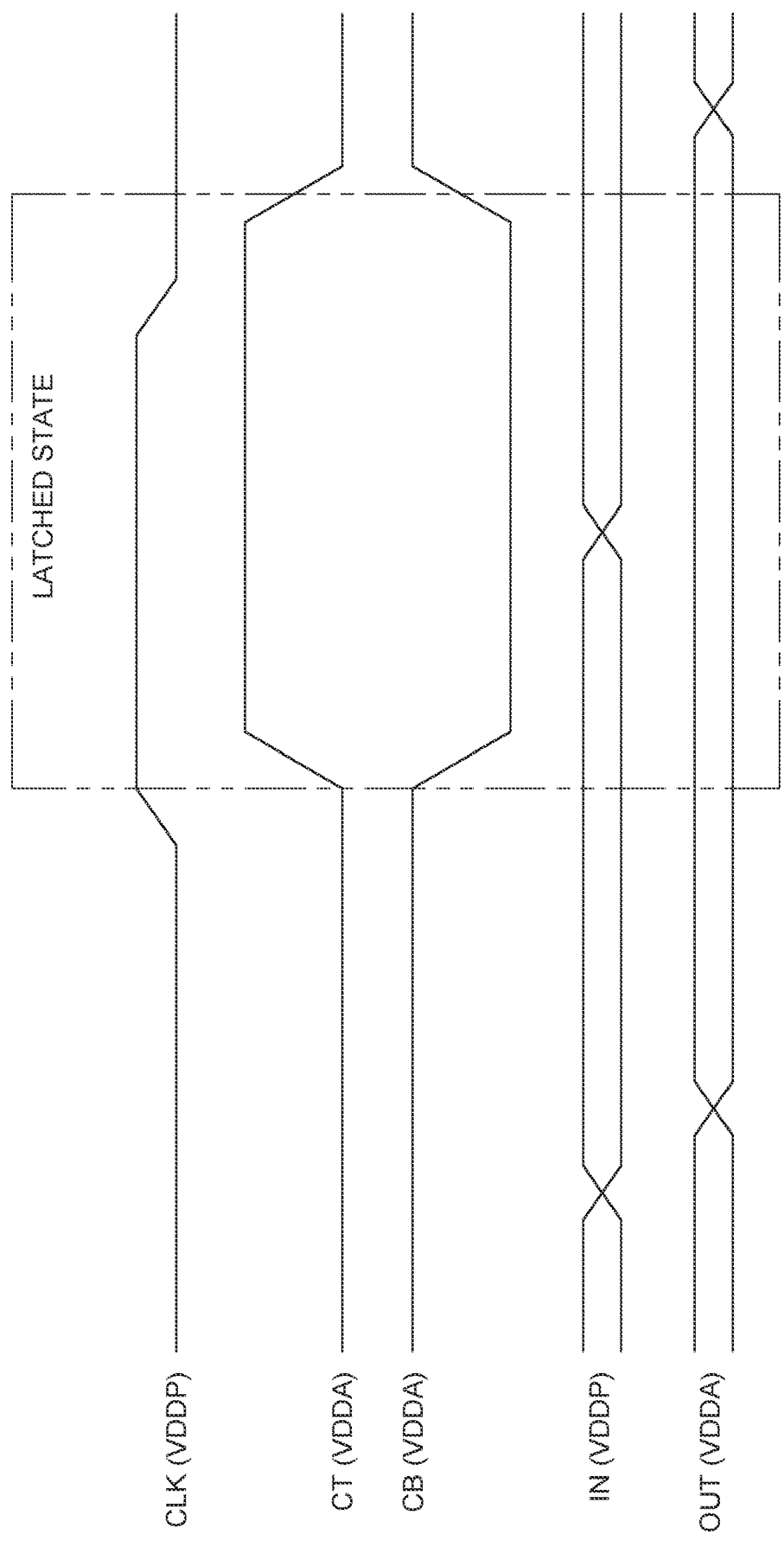
FIG. 12 illustrates a timing diagram of a waveform of the integrated level shifter and latch circuitry of FIG. 11.

In a latch mode illustrated in the integrated level shifter and latch circuitry 1100 of FIG. 11 and the waveforms of FIG. 12, the clock signal CLK and the latch clock signal LCLK transitions to a high value. The clock signal CT transitions to a high value and the clock signal CB transitions to a low value. Driving the clock signals CLK and LCLK to a high value enables the latch elements of the integrated level shifter and latch circuit. The transistors MN1 is disconnected from ground, electrically floating the transistors MN7, MN8, MN9, and MN10. Further, data is captured via the cross-coupled transistors MN3 and MN4 and the cross-coupled PMOS transistors MP1 and MP2. Both a value of 1 (e.g., a high voltage value) and a value of 0 (e.g., a low voltage value) may be latched. In the latch mode, values on the inputs can be switched, however, as the transistors MN7-MN10 are electrically floated, the output is not affected.

In a power down mode of a power supply, the transistors MP1, MP2, MN3, and MN4 function as a latch. In the power down mode, the value of the signal OUT/OUTB is retained regardless of any changes to the input signal.

In the above, an IC device having a memory device is described. The memory device includes integrated level shifter and latch circuitry within the bitcell and periphery circuitry and testing circuitry to shift signals between first and second power supply domains. The integrated level shifter and latch circuitry performs the functions of both a level shifter circuit and a latch circuit, reducing the circuit size of the corresponding IC device and errors within the memory device when memory modes are changed (e.g., turning off a power supply).

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A memory device comprising:
  clock signal generation circuitry configured to receive a first clock signal and an isolation signal, and generate a second clock signal based on the first clock signal and the isolation signal, the isolation signal corresponds to a power state of a power supply associated with the first clock signal, wherein the second clock signal maintains a first voltage value based on the isolation signal indicating a power off state of the power supply and that the first clock signal is stopped, and the second clock signal includes transitions between the first voltage value and a second voltage value based on the isolation signal indicating a power on state of the power supply; and
  first integrated level shifter and latch circuitry configured to:
    receive an input signal in a first power supply domain;
    latch a value the input signal based on the second clock signal, wherein the first integrated level shifter maintains the latch of the value based on the second clock signal maintaining the first voltage value and the isolation signal indicating the power off state of the power supply and that the first clock signal is stopped; and
    output, based on the latched value, an output signal in a second power supply domain different than the first power supply domain.

2. The memory device of claim 1, wherein generating the second clock signal includes maintaining a voltage level of the second clock signal at the first voltage value based on the isolation signal indicating the power off state of the power supply.

3. The memory device of claim 1, wherein the clock signal generation circuitry comprises:
  level shifter circuitry configured to receive the first clock signal in the first power supply domain and output a shifted clock signal in a second power domain; and
  combinatorial logic configured to receive the shifted clock signal and the isolation signal, and generate the second clock signal based on the shifted clock signal and the isolation signal.

4. The memory device of claim 1, wherein the first integrated level shifter and latch circuitry comprises:
  first transistors configured to shift the input signal from the first power supply domain to the second power supply domain based on the second clock signal having a first value;
  second transistors coupled to the first transistors and configured to latch a value based on the second clock signal having a second value; and
  third transistors configured to output a first output signal based on a clamping signal, wherein the output signal corresponds to one of the shifted input signal and the latched value.

5. The memory device of claim 4, wherein the first transistors comprise cross-coupled PMOS transistors.

6. The memory device of claim 4, wherein the second transistors comprise cross-coupled NMOS transistors.

7. The memory device of claim 4, wherein the third transistors are configured to disconnect one or more of the second transistors from a reference voltage based on the clamping signal.

8. The memory device of claim 1 further comprising:
  decode circuitry configured to receive the output signal from the first integrated level shifter and latch circuitry and output one or more control signals, wherein the input signal includes address data for a memory command; and
  bitcell array configured to receive the one or more control signals, wherein the one or more control signals are configured to active a row and column within the bitcell array.

9. The memory device of claim 8 further comprising:
  sense amplifier circuitry coupled to the bitcell array, and configured to output a first data signal from the bitcell array;
  write driver circuitry coupled to the bitcell array and configured to write a second data signal to the bitcell array;
  second integrated level shifter and latch circuitry connected to an output of the sense amplifier circuitry, and configured to receive the first data signal and shift the first data signal from the second power supply domain to the first power supply domain; and
  third integrated level shifter and latch circuitry coupled to an input of the sense amplifier circuitry, and configured to receive the second data signal and shift the second data signal from the first power supply domain to the second power supply domain, wherein the driver circuitry is configured to receive the second data signal in the second power supply domain.

10. The memory device of claim 1 further comprising: testing circuitry comprising:
  a first functional path comprising the first integrated level shifter and latch circuitry, wherein the input signal is a first data signal; and
  scan chain circuitry coupled to the output of the first integrated level shifter and latch circuitry and to an output of level shifter circuitry, the scan chain circuitry configured to output a second output signal based on one of the output of the first integrated level shifter and latch circuitry and the output of level shifter circuitry.

11. A circuit device configured to:
  receive a first input signal in a first power supply domain;
  latch a value of the first input signal based on a latch clock signal, wherein the latch clock signal is generated based on a first clock signal associated with the first power supply domain and an isolation signal that corresponds to a power state of a power supply associated with the first power supply domain, wherein the latch clock signal maintains a first voltage value based on the isolation signal indicating a power off state of the power supply and that the first clock signal is stopped, and the latch clock signal includes transitions between the first voltage value and a second voltage value based on the isolation signal indicating a power on state of the power supply;
  maintain the latch of the value based on the latch clock signal maintaining the first voltage value and the isolation signal indicating the power off state of the power supply and that the first clock signal is stopped; and
  output, based on the latched value, a first output signal in a second power supply domain different than the first power supply domain.

12. The circuit device of claim 11 further comprising:
  first transistors configured to shift the first input signal from the first power supply domain to the second power supply domain based on the latch clock signal having a first value;
  second transistors coupled to the first transistors and configured to latch a value of the first input signal based on the latch clock signal having a second value; and
  third transistors configured to output the first output signal based on a clamping signal, wherein the first output signal corresponds to one of the shifted input signal and the latched value.

13. The circuit device of claim 12, wherein the first transistors comprise first cross-coupled transistors, and wherein the second transistors comprise second cross-coupled transistors.

14. The circuit device of claim 12, wherein the third transistors are configured to disconnect one or more of the second transistors from a reference voltage based on the clamping signal.

15. An integrated circuit (IC) device comprising:
  logic circuitry configured to output a first clock signal and a control signal, wherein the logic circuitry operates in a first power supply domain;
  memory circuitry configured to receive the first clock signal and one or more data signals, the memory circuitry comprising:
    clock signal generation circuitry configured to receive the first clock signal and an isolation signal, and generate a second clock signal based the first clock signal and the isolation signal, the isolation signal corresponds to a power state of a power supply associated with the first clock signal, wherein the second clock signal maintains a first voltage value based on the isolation signal indicating a power off state of the power supply and that the first clock signal is stopped, and the second clock signal includes transitions between the first voltage value and a second voltage value based on the isolation signal indicating a power on state of the power supply;

first integrated level shifter and latch circuitry configured to:
receive a first data signal of the one or more data signals in the first power supply domain;
latch a value of the first data signal based on the second clock signal, wherein the first integrated level shifter maintains the latch of the value based on the second clock signal maintaining the first voltage value and the isolation signal indicating the power off state of the power supply and that the first clock signal is stopped; and
output a first output signal in a second power supply domain different than the first power supply domain; and
bitcell circuitry comprising bitcells, wherein a bitcell of the bitcells is configured to be updated based on the first output signal.

16. The IC device of claim 15 further comprising:
testing circuitry comprising:
a first functional path comprising a second integrated level shifter and latch circuitry configured to:
receive a second data signal of the one or more data signals in the first power supply domain;
latch a value of the second data signal based on the second clock signal; and
output, based on the latched value, a second output signal in the second power supply domain; and
scan chain circuitry coupled to the output of the second integrated level shifter and latch circuitry and to an output of level shifter circuitry, the scan chain circuitry configured to output the second output signal based on one of the second output signal and the output of level shifter circuitry.

17. The IC device of claim 15, wherein the clock signal generation circuitry comprises:
level-shifter circuitry configured to receive the first clock signal in the first power supply domain and output a shifted clock signal in a second power domain; and
combinatorial logic configured to receive the shifted clock signal and the isolation signal, and generate the second clock signal based on the shifted clock signal and the isolation signal.

18. The IC device of claim 15, wherein the first integrated level shifter and latch circuitry comprises:
first transistors configured to shift the first data signal from the first power supply domain to the second power supply domain based on the second clock signal having a first value;
second transistors coupled to the first transistors and configured to latch a value based on the second clock signal having a second value; and
third transistors configured to output the first output signal based on a clamping signal, wherein the first output signal corresponds to one of the shifted input signal and the value.

19. The IC device of claim 18, wherein the third transistors are configured to disconnect one or more of the second transistors from a reference voltage based on the clamping signal.

* * * * *